United States Patent
Nakamura et al.

(10) Patent No.: US 10,622,230 B2
(45) Date of Patent: Apr. 14, 2020

(54) PROTECTIVE TAPE ATTACHING METHOD

(71) Applicant: DISCO CORPORATION, Tokyo (JP)

(72) Inventors: Masaru Nakamura, Tokyo (JP); Yuya Matsuoka, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 0 days.

(21) Appl. No.: 15/988,953

(22) Filed: May 24, 2018

(65) Prior Publication Data

US 2018/0350641 A1 Dec. 6, 2018

(30) Foreign Application Priority Data

May 31, 2017 (JP) ................ 2017-107769

(51) Int. Cl.

| | | |
|---|---|---|
| H01L 21/67 | (2006.01) | |
| H01L 21/683 | (2006.01) | |
| B32B 37/26 | (2006.01) | |
| B32B 7/12 | (2006.01) | |
| B32B 37/10 | (2006.01) | |
| B32B 7/06 | (2019.01) | |
| B32B 38/10 | (2006.01) | |
| B32B 38/00 | (2006.01) | |
| B32B 37/18 | (2006.01) | |
| B32B 37/12 | (2006.01) | |

(52) U.S. Cl.
CPC ......... *H01L 21/67132* (2013.01); *B32B 7/06* (2013.01); *B32B 7/12* (2013.01); *B32B 37/10* (2013.01); *B32B 37/26* (2013.01); *B32B 38/10* (2013.01); *H01L 21/6836* (2013.01); *B32B 37/12* (2013.01); *B32B 37/18* (2013.01); *B32B 38/0008* (2013.01); *B32B 2037/268* (2013.01); *B32B 2310/0831* (2013.01); *B32B 2457/14* (2013.01); *H01L 21/67115* (2013.01); *H01L 2221/6834* (2013.01); *H01L 2221/68327* (2013.01)

(58) Field of Classification Search
None
See application file for complete search history.

(56) References Cited

U.S. PATENT DOCUMENTS

| | | | | |
|---|---|---|---|---|
| 6,238,515 B1* | 5/2001 | Tsujimoto | ......... | H01L 21/67132 156/249 |
| 2002/0187589 A1* | 12/2002 | Tsujimoto | ......... | H01L 21/67132 438/118 |
| 2004/0007327 A1* | 1/2004 | Kobayashi | ........ | H01L 21/67132 156/353 |

FOREIGN PATENT DOCUMENTS

| | | |
|---|---|---|
| JP | 2000288881 A | 10/2000 |
| JP | 2002192370 A | 7/2002 |
| JP | 2005116928 A | 4/2005 |

* cited by examiner

*Primary Examiner* — Abbas Rashid
*Assistant Examiner* — Adrianna N Konves
(74) *Attorney, Agent, or Firm* — Greer Burns & Crain, Ltd.

(57) ABSTRACT

Disclosed herein is a protective tape attaching method for attaching a protective tape to a wafer, the protective tape having a size corresponding to the size of the wafer. The protective tape attaching method includes: a bending step of bending a release paper to which an adhesive layer of the protective tape is previously attached, stretching the release paper to peel a front end portion of the protective tape from the release paper, and attaching the front end portion of the protective tape to the wafer; and an attaching step of pressing the other side of the protective tape opposite to the adhesive layer by using a pressure roller to thereby bring the adhesive layer of the protective tape into close contact with the wafer after performing the bending step.

1 Claim, 3 Drawing Sheets

PROTECTIVE TAPE ATTACHING METHOD

BACKGROUND OF THE INVENTION

Field of the Invention

The present invention relates to a protective tape attaching method and a protective tape attaching apparatus for attaching a protective tape to the front side of a wafer.

Description of the Related Art

In processing a wafer having a plurality of devices such as integrated circuits (ICs) and large scale integrated circuits (LSIs) formed on the front side so as to be separated by a plurality of division lines, a protective tape is first attached to the front side of the wafer, and the back side of the wafer is next ground by using a grinding apparatus in the condition where the protective tape attached to the front side of the wafer is held on a chuck table included in the grinding apparatus, thereby reducing the thickness of the wafer to a predetermined thickness (see Japanese Patent Laid-Open No. 2000-288881, for example).

As another example of wafer processing, a protective tape is first attached to the front side of the wafer, and a laser beam having a transmission wavelength to the wafer is next applied to the back side of the wafer by using a laser processing apparatus in the condition where the protective tape attached to the front side of the wafer is held on a chuck table included in the laser processing apparatus, thereby forming a modified layer as a division start point inside the wafer along each division line (see Japanese Patent No. 3408805, for example).

The protective tape is attached to the front side of the wafer by using a protective tape attaching apparatus to be applied to the grinding apparatus or the laser processing apparatus mentioned above. The protective tape has a size corresponding to the size of the wafer. The protective tape is previously attached to a release paper to form a sheet, which is previously rolled to form a protective tape roll. That is, the sheet is composed of the release paper and the protective tape attached thereto. The protective tape attaching apparatus has a function of feeding the sheet from the protective tape roll, peeling the protective tape from the release paper, and attaching the protective tape to the wafer in the condition where the release paper is stretched. (see Japanese Patent Laid-Open No. 2005-116928, for example)

SUMMARY OF THE INVENTION

In peeling the protective tape from the release paper, the release paper is bent to peel the protective tape (bending step). To reliably peel the protective tape from the release paper, the adhesion of an adhesive layer formed on one side of the protective tape attached to the release paper may be set to a low strength. However, the protective tape functions to protect the front side of the wafer in the next step after peeling the protective tape from the release paper and attaching the protective tape to the front side of the wafer. Therefore, the adhesion of the adhesive layer of the protective tape must be set to a high strength to such an extent that even when strong shock is applied to the wafer in the next step, e.g., in a grinding step, the protective tape is not slipped or peeled from the wafer. Thusly, the adhesion of the adhesive layer of the protective tape must be set in consideration of both the point that the protective tape can be easily peeled from the release paper and the point that the protective tape can be reliably attached to the wafer. Further, in order to avoid erroneous peeling of the protective tape from the release paper in the protective tape attaching apparatus, it is necessary to suitably adjust not only the adhesion of the adhesive layer of the protective tape, but also the feed speed of the sheet having the protective tape to be fed from the protective tape roll and the angle of bend of the release paper in the bending step.

The protective tape attached to the release paper is precut so as to have a size corresponding to the size of the wafer to be used. For example, the protective tape is a circular tape having a diameter substantially equal to the diameter of the wafer. However, the outer circumferential portion of the protective tape is pressed against the release paper more strongly than the other portion, so that the protective tape may be hard to peel from the release paper in some case. Accordingly, in the bending step to be performed by the protective tape attaching apparatus mentioned above, it is not easy to reliably peel the protective tape from the release paper without the occurrence of erroneous peeling.

It is therefore an object of the present invention to provide a protective tape attaching method which can reliably peel a front end portion of the protective tape from the release paper and can also reliably attach the protective tape to the wafer.

It is another object of the present invention to provide a protective tape attaching apparatus for performing the protective tape attaching method mentioned above.

In accordance with a first aspect of the present invention, there is provided a protective tape attaching method for attaching a protective tape to a wafer, the protective tape having an adhesive layer formed on one side, the adhesive layer having adhesion to be reduced by applying ultraviolet light, the protective tape having a size corresponding to the size of the wafer, the protective tape attaching method including a bending step of bending a release paper to which the adhesive layer of the protective tape is previously attached, stretching the release paper to peel a front end portion of the protective tape from the release paper, and attaching the front end portion of the protective tape to the wafer; an attaching step of pressing the other side of the protective tape opposite to the adhesive layer by using a pressure roller to thereby bring the adhesive layer of the protective tape into close contact with the wafer after performing the bending step, and further stretching the release paper to fully peel the protective tape from the release paper and attach the whole of the protective tape to the wafer; and a peeling start point forming step of previously applying the ultraviolet light to the front end portion of the protective tape to thereby reduce the adhesion of the adhesive layer of the front end portion before performing the bending step, thereby forming a peeling start point where peeling of the protective tape from the release paper is started, at the front end portion of the protective tape.

In accordance with a second aspect of the present invention, there is provided a protective tape attaching apparatus for attaching a protective tape to a wafer, the protective tape having an adhesive layer formed on one side, the adhesive layer having adhesion to be reduced by applying ultraviolet light, the protective tape having a size corresponding to the size of the wafer, the protective tape attaching apparatus including holding means for holding the wafer; sheet feeding means for feeding a sheet from a protective tape roll, the sheet being composed of a release paper and the protective tape, the adhesive layer of the protective tape being previously attached to the release paper, the protective tape roll being previously formed by rolling the sheet; release paper winding means for winding the release paper; bending means for bending the release paper, stretching the release paper in cooperation with the sheet feeding means and the release paper winding means to peel a front end portion of the protective tape from the release paper, and attaching the front end portion of the protective tape to the wafer held by the holding means; attaching means for pressing the other side of the protective tape opposite to the adhesive layer by using a pressure roller to thereby bring the adhesive layer of the protective tape into close contact with the wafer, and further stretching the release paper in cooperation with the sheet feeding means and the release paper winding means to fully peel the protective tape from the release paper and attach the whole of the protective tape to the wafer; and ultraviolet applying means for previously applying the ultraviolet light to the front end portion of the protective tape to thereby reduce the adhesion of the adhesive layer of the front end portion before operating the bending means, thereby forming a peeling start point where peeling of the protective tape from the release paper is started, at the front end portion of the protective tape.

According to the first aspect of the present invention, ultraviolet light is previously applied to the front end portion of the protective tape to thereby reduce the adhesion of the adhesive layer of the front end portion before performing the bending step, thereby forming the peeling start point where peeling of the protective tape from the release paper is started, at the front end portion of the protective tape. Accordingly, a part of the outer circumferential portion of the protective tape (i.e., the front end portion of the protective tape) can be reliably peeled from the release paper. Furthermore, the protective tape can be reliably attached to the wafer.

According to the second aspect of the present invention, the protective tape attaching apparatus includes the ultraviolet applying means for previously applying ultraviolet light to the front end portion of the protective tape to thereby reduce the adhesion of the adhesive layer of the front end portion before operating the bending means, thereby forming the peeling start point where peeling of the protective tape from the release paper is started, at the front end portion of the protective tape. Accordingly, a part of the outer circumferential portion of the protective tape (i.e., the front end portion of the protective tape) can be reliably peeled from the release paper. Furthermore, the protective tape can be reliably attached to the wafer.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

Figure 1:
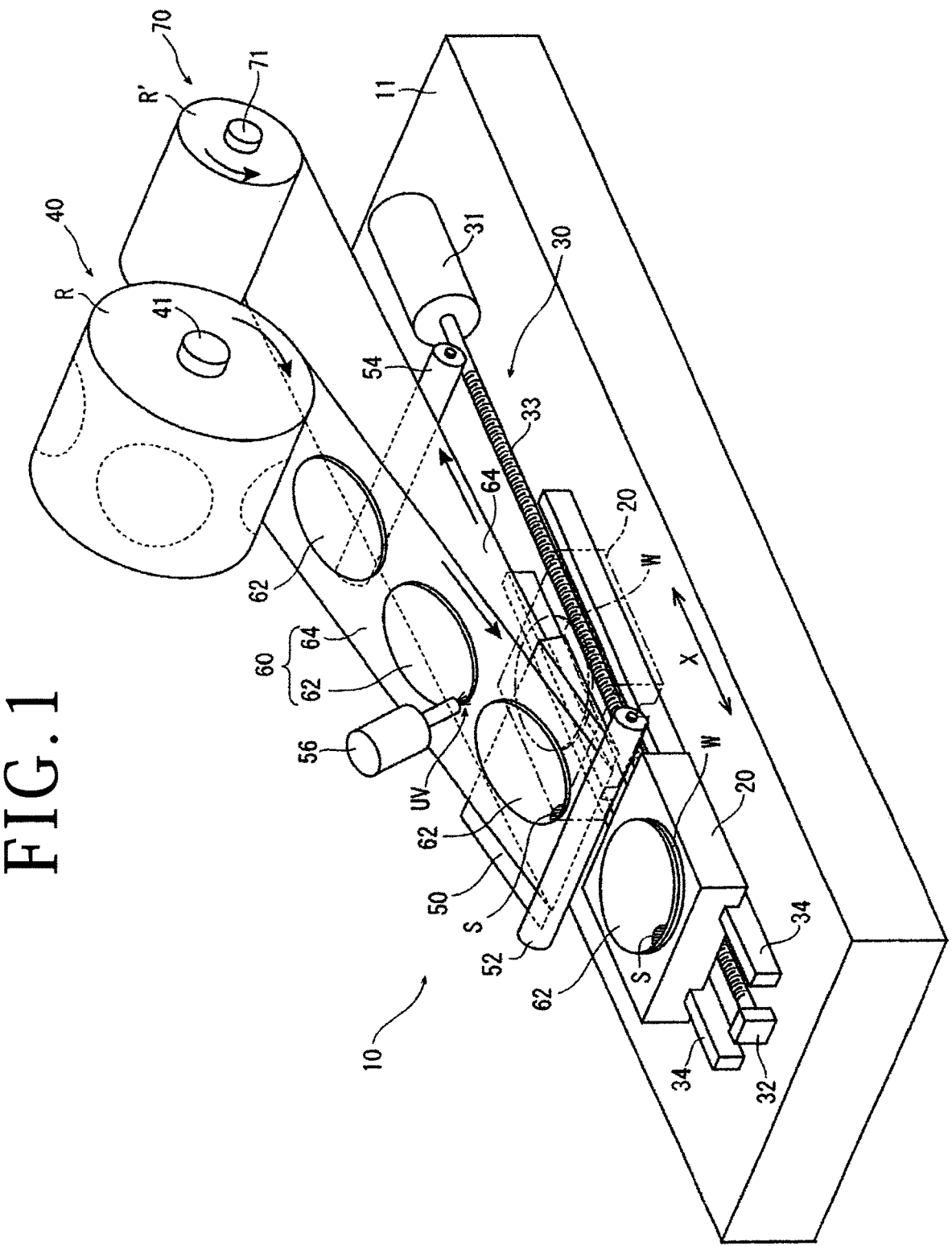
FIG. 1 is a schematic perspective view of a protective tape attaching apparatus according to a preferred embodiment of the present invention.

There will now be described in detail with reference to the attached drawings a protective tape attaching method according to a preferred embodiment of the present invention and a protective tape attaching apparatus for realizing the protective tape attaching method. Referring to FIG. 1, there is depicted a perspective view of a protective tape attaching apparatus 10 according to a preferred embodiment of the present invention. In FIG. 1, there are not depicted for convenience of illustration a cover for covering the whole of the protective tape attaching apparatus 10, a support structure for supporting various means included in the protective tape attaching apparatus 10, and a support frame, for example.

As depicted in FIG. 1, the protective tape attaching apparatus 10 includes a base 11 for mounting various means for performing the steps of the protective tape attaching method. There are provided on the base 11 a holding table 20 as holding means for holding a wafer W, moving means 30 for moving the holding table 20 in the X direction depicted by an arrow X in FIG. 1, sheet feeding means 40 for feeding a sheet 60 from a protective tape roll R to be hereinafter described, and release paper winding means 70 for winding a release paper 64 after peeling a protective tape 62 from the release paper 64. The sheet 60 is composed of the release paper 64 and a plurality of protective tapes 62 attached to the release paper 64.

A vacuum chuck (not depicted) for holding the wafer W under suction is provided on the upper surface of the holding table 20. The vacuum chuck is formed of a porous material and has an upper surface present in a substantially horizontal plane. The vacuum chuck is a circular member having a diameter substantially equal to the diameter of the wafer W. The vacuum chuck is connected through a suction passage (not depicted) to suction means (not depicted), and the suction passage is formed inside the holding table 20.

The moving means 30 includes a ball screw 33 extending in the X direction. The ball screw 33 is connected at one end thereof to a motor 31 provided on the base 11. The other end of the ball screw 33 is supported to a support member 32 provided on the base 11. The ball screw 33 is provided with a nut portion (not depicted), which is fixed to the lower surface of the holding table 20. Accordingly, when the motor 31 is operated, the ball screw 33 is rotated to move the holding table 20. That is, a rotary motion of the motor 31 is converted into a linear motion by the ball screw 33, and the linear motion is transmitted to the holding table 20. A pair of parallel guide rails 34 are provided on the base 11 so as to extend in the X direction. The holding table 20 is slidably mounted on the guide rails 34. Accordingly, the holding table 20 is adapted to be moved back and forth along the guide rails 34 in the X direction.

Each protective tape 62 is composed of a base sheet and an adhesive layer (paste layer) formed on the base sheet. The base sheet is formed of polyvinyl chloride or polyolefin, for example. The adhesive layer is formed of acrylic adhesive. Each protective tape 62 is a circular tape precut so as to have a diameter substantially equal to the diameter of the wafer W to which the protective tape 62 is to be attached. Each protective tape 62 is an ultraviolet curing type tape such that the adhesion of the adhesive layer is reduced by applying ultraviolet light. The plural protective tapes 62 are previously attached to one side of the release paper 64 at given positions so as to be arranged at given intervals in the longitudinal direction of the release paper 64, thus forming the elongated sheet 60 composed of the release paper 64 and the plural protective tapes 62. More specifically, each protective tape 62 is positioned at the lateral center of the release paper 64. The elongated sheet 60 is supported in the form of the protective tape roll R by a support roller 41 constituting the sheet feeding means 40. The support roller 41 is connected to an output shaft of a motor (not depicted). This motor is operated so as to intermittently rotate the support roller 41, so that the sheet 60 is intermittently fed by a given length from the protective tape roll R.

The protective tape attaching apparatus 10 further includes a wedge-shaped bending plate 50 constituting bending means for bending the release paper 64 at a sharp angle (acute angle) in peeling each protective tape 62 from the release paper 64 of the sheet 60 fed from the protective tape roll R by the operation of the sheet feeding means 40. The release paper winding means 70 includes a winding roller 71 for winding the release paper 64 bent by the bending plate 50 and then supporting the release paper 64 in the form of a roll R'. Thus, the release paper 64 from which each protective tape 62 has been peeled is wound by the winding roller 71 and supported as the roll R'. A motor (not depicted) is also connected to the winding roller 71. This motor is operated in concert with the feeding operation of the sheet feeding means 40. That is, the winding of the release paper 64 by the winding roller 71 is performed in concert with the feeding of the sheet 60 by the support roller 41 in such a manner that the tension of the release paper 64 on the downstream side of the bending plate 50 becomes constant.

A pressure roller 52 is provided in the vicinity of the front end of the bending plate 50, and the front end of the bending plate 50 has a sharp angle for effecting a sharp bend of the release paper 64. Accordingly, the release paper 64 is bent by the sharp front end of the bending plate 50. At this time, each protective tape 62 is peeled from the release paper 64. The pressure roller 52 functions to press each protective tape 62 against the upper surface of the wafer W held on the holding table 20 after peeling each protective tape 62 from the release paper 64. The pressure roller 52 is vertically movable by elevating means (not depicted). Further, a tension roller 54 is provided on the downstream side of the bending plate 50 toward the winding roller 71. The tension roller 54 functions to apply an upward force to the lower surface of the release paper 54 in such a manner that the tension of the release paper 64 to be bent by the bending plate 50 is maintained at a constant value. The support roller 41 is adapted to be vertically moved according to the diameter of the protective tape roll R, and the winding roller 71 is also adapted to be vertically moved according to the diameter of the roll R'. Accordingly, even when the diameter of the protective tape roll R and the diameter of the roll R' are changed, the angle of bend of the release paper 64 by the bending plate 50 can be fixed. Further, the feeding position of the sheet 60 from the protective tape roll R and the winding position of the release paper 64 to the roll R' can also be fixed.

The protective tape attaching apparatus 10 further includes ultraviolet applying means 56 for applying ultraviolet light to each protective tape 62 in a direction perpendicular thereto. The ultraviolet applying means 56 is provided above the sheet 60 stretched between the sheet feeding means 40 and the bending plate 50. The ultraviolet applying means 56 is positioned above the lateral center of the sheet 60 as depicted in FIG. 1. Although not depicted, a sensor is provided to detect the pass of each protective tape 62 directly below the ultraviolet applying means 56. When the pass of each protective tape 62 is detected by this sensor, ultraviolet light is applied from the ultraviolet applying means 56 to the front end of each protective tape 62.

There will now be described a protective tape attaching method using the protective tape attaching apparatus 10 having the above configuration, with reference to FIGS. 2 to 5.

Prior to performing the protective tape attaching method, an operator prepares the protective tape roll R and fixes it to the support roller 41 of the sheet feeding means 40. As mentioned above, the protective tape roll R is a roll of the sheet 60 composed of the release paper 64 and the plural protective tapes 62 attached to the release paper 64. The plural protective tapes 62 are arranged at given intervals in the longitudinal direction of the release paper 64 and positioned at the lateral center of the release paper 64.

The protective tapes 62 are not attached on a leading portion of the sheet 60 having a predetermined length. The operator draws out this leading portion of the sheet 60 from the protective tape roll R supported on the support roller 41, then bends this leading portion of the sheet 60 at the front end of the bending plate 50, and then fixes this leading portion of the sheet 60 to the winding roller 71.

At the time of fixing the protective tape roll R to the support roller 41, the operator places the wafer W on the vacuum chuck of the holding table 20. The wafer W is then held on the vacuum chuck under suction. The holding table 20 thus holding the wafer W is initially set at a standby position depicted in FIG. 2 (this standby position being also depicted by a phantom line in FIG. 1).

Figure 2:
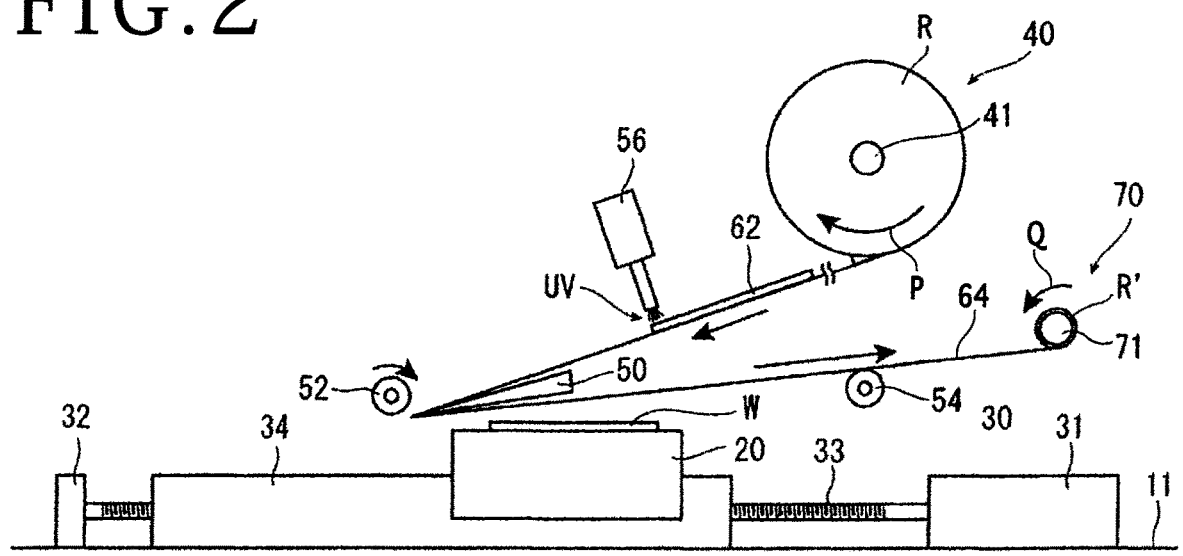
FIG. 2 is a side view depicting a preparation step to be performed before performing a protective tape attaching method using the protective tape attaching apparatus depicted in FIG. 1.

After fixing the leading portion of the sheet 60 to the winding roller 71, the sheet feeding means 40 is operated to rotate the support roller 41 in the direction depicted by an arrow P in FIG. 2, and the release paper winding means 70 is also operated to rotate the winding roller 71 in the direction depicted by an arrow Q in FIG. 2. Accordingly, the front end of the first protective tape 62 attached to the release paper 64 is positioned directly below the ultraviolet applying means 56 as depicted in FIG. 2.

When the front end of the first protective tape 62 is positioned directly below the ultraviolet applying means 56, ultraviolet light is applied from the ultraviolet applying means 56 to the first protective tape 62 in an area ranging from the front end of the first protective tape 62 toward the center thereof preferably by a distance of approximately 1 cm, more preferably by a distance of approximately 5 mm. The ultraviolet light is applied for a predetermined time period (e.g., 0.5 to 1 second). As mentioned above, each protective tape 62 is an ultraviolet curing type tape such that the adhesion of the adhesive layer is reduced by the application of ultraviolet light. Accordingly, the adhesion of the front end portion of the first protective tape 62 in the above area irradiated with the ultraviolet light is reduced to thereby form a peeling start point S (see FIG. 3) where the first protective tape 62 starts to be peeled from the release paper 64 in a bending step to be hereinafter described. The time period for the application of the ultraviolet light may be suitably set according to the output power of the ultraviolet applying means 56 and the adhesion of the adhesive layer of each protective tape 62, for example.

Figure 3:
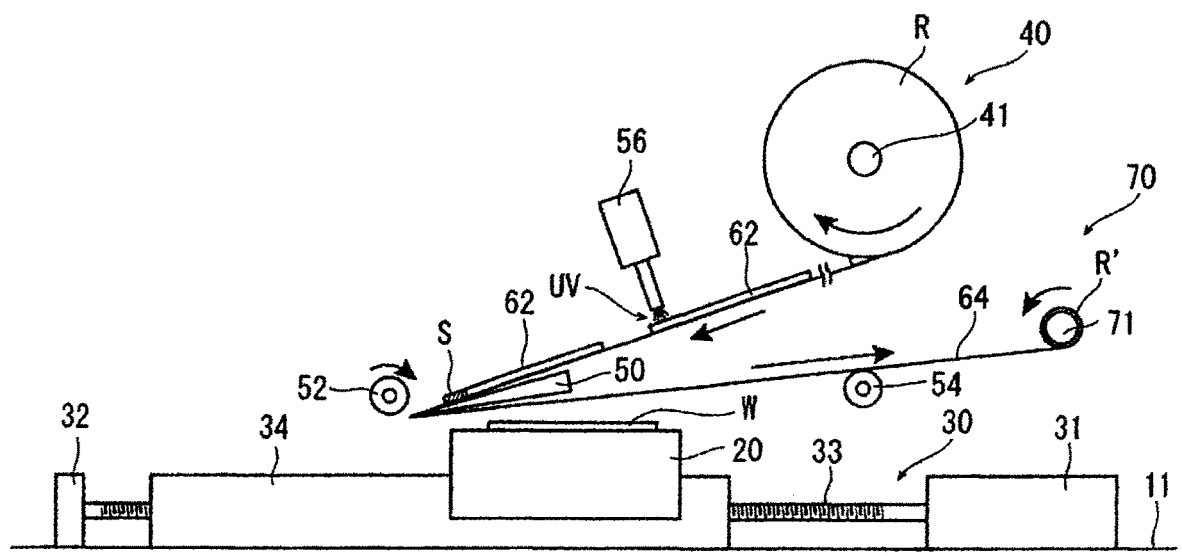
FIG. 3 is a side view depicting a peeling start point forming step subsequent to the step depicted in FIG. 2.

After applying ultraviolet light from the ultraviolet applying means 56 to the front end portion of the first protective tape 62 in the above predetermined area to thereby form the peeling start point S at this front end portion of the first protective tape 62 as depicted in FIG. 3, the sheet feeding means 40 and the release paper winding means 70 are operated to feed the sheet 60 from the protective tape roll R by a predetermined amount so that the front end portion of the second protective tape 62 is positioned directly below the ultraviolet applying means 56. When the front end portion of the second protective tape 62 is thus positioned directly below the ultraviolet applying means 56, ultraviolet light is applied from the ultraviolet applying means 56 to the front end portion of the second protective tape 62 to thereby form a similar peeling start point S at this front end portion where the adhesion of the adhesive layer is reduced. In this manner, when the front end portion of each protective tape 62 is positioned directly below the ultraviolet applying means 56, ultraviolet light is applied from the ultraviolet applying means 56 to the front end portion of each protective tape 62 to thereby form a peeling start point S at the front end portion of each protective tape 62 (peeling start point forming step).

Figure 4:
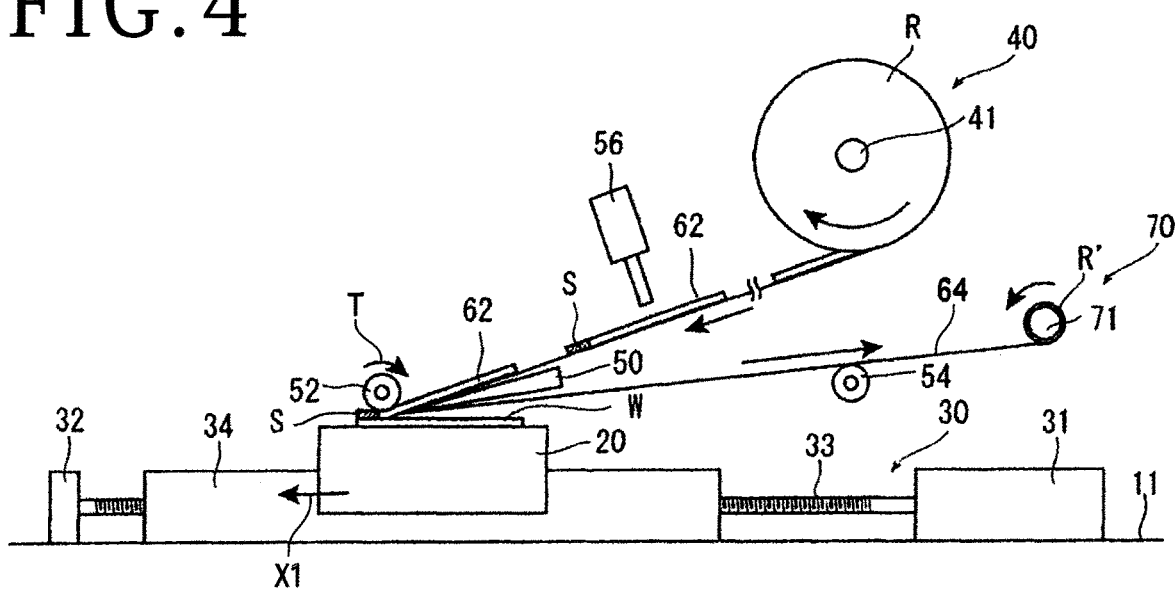
FIG. 4 is a side view depicting a bending step subsequent to the step depicted in FIG. 3.
Figure 5:
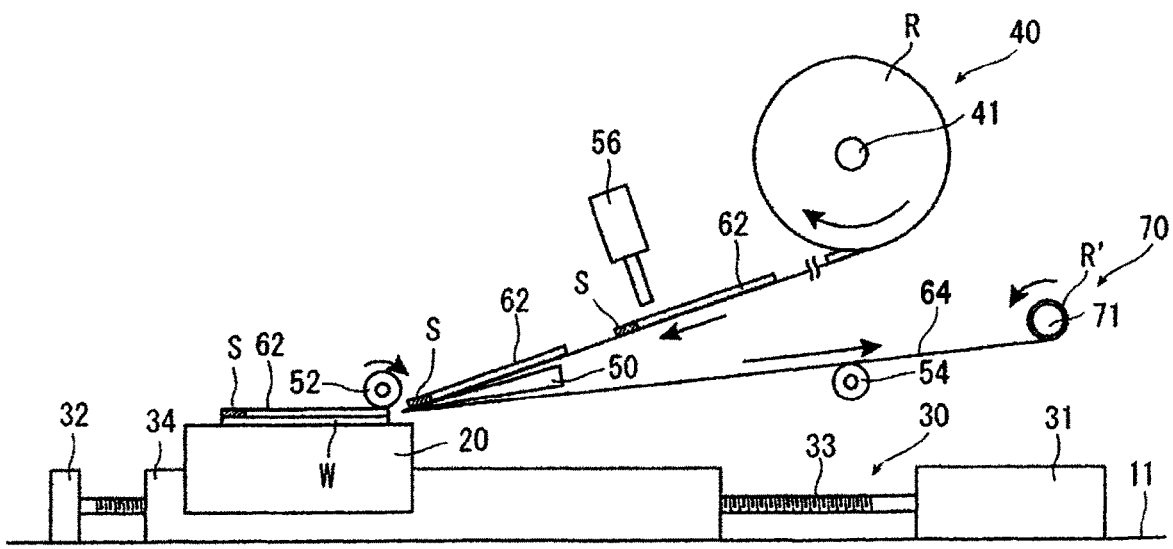
FIG. 5 is a side view depicting an attaching step subsequent to the step depicted in FIG. 4.

Thereafter, the sheet feeding means 40 and the release paper winding means 70 are operated to further feed the sheet 60 from the protective tape roll R, so that the peeling start point S of the first protective tape 62 reaches the front end of the bending plate 50 as depicted in FIG. 4. Thereafter, the release paper 64 is bent at a sharp angle by the front end of the bending plate 50, so that the front end portion of the first protective tape 62 is peeled from the release paper 64. As mentioned above, the peeling start point S is formed at the front end portion of each protective tape 62 and the adhesion of the adhesive layer of each protective tape 62 is reduced at this peeling start point S by the application of ultraviolet light. Accordingly, when the release paper 64 of the sheet 60 is bent by the front end of the bending plate 50, the front end portion of each protective tape 62 can be reliably peeled from the release paper 64.

In concert with the movement of the peeling start point S of the first protective tape 62 to the front end of the bending plate 50, the moving means 30 is operated to move the holding table 20 in the direction depicted by an arrow X1 in FIG. 4. At this time, the moving means 30 is operated so that the front end of the wafer W held on the holding table 20 comes into coincidence in position with the front end of the first protective tape 62, i.e., the peeling start point S formed at the front end portion of the first protective tape 62 as depicted in FIG. 4. When the front end of the wafer W comes into coincidence in position with the front end of the first protective tape 62 near the front end of the bending plate 50, the pressure roller 52 is operated to press the first protective tape 62 against the wafer W. More specifically, the pressure roller 52 is rotated in the direction depicted by an arrow T in FIG. 4, i.e., in the direction (clockwise direction as viewed in FIG. 4) where the sheet 60 is fed. Further, the pressure roller 52 is lowered to press the first protective tape 62 against the upper surface of the wafer W held on the holding table 20, thereby bringing the front end portion of the first protective tape 62 into close contact with the upper surface of the wafer W as depicted in FIG. 4. This step is a bending step of the protective tape attaching method according to this preferred embodiment.

After performing the bending step, the sheet feeding means 40 and the release paper winding means 70 are operated to further feed the sheet 60 and further wind the release paper 64. At the same time, the holding table 20 is also further moved in the direction X1 in concert with the feed speed of the sheet 60. As a result, the first protective tape 62 partially superimposed on the wafer W held on the holding table 20 is completely peeled from the release paper 64 and the whole of the first protective tape 62 is attached to the whole of the upper surface of the wafer W by the operation of the pressure roller 52. Thus, an attaching step of the protective tape attaching method according to this preferred embodiment is finished (see FIG. 5).

After performing the attaching step, all of the sheet feeding means 40, the release paper winding means 70, and the suction means applying a vacuum to the vacuum chuck of the holding table 20 are stopped in operation. Thereafter, the wafer W with the first protective tape 62 attached is removed (unloaded) from the holding table 20, and another wafer W to which the second protective tape 62 is to be attached is next placed on the vacuum chamber of the holding table 20 and then held on the vacuum chuck under suction by operating the suction means. Thereafter, the moving means 30 is operated again to move the holding table 20 to the standby position depicted in FIG. 3. Thereafter, the bending step and the attaching step are intermittently repeated to thereby sequentially attach the plural protective tapes 62 to a plurality of wafers W. The loading and unloading of the wafer W with respect to the holding table 20 may be performed by the operator or may be automatically performed by an automated transfer apparatus (not depicted).

According to this preferred embodiment, the adhesion of each protective tape 62 is reduced at only the front end portion of each protective tape 62 as a small area by applying ultraviolet light. Accordingly, in the protective tape attaching apparatus 10, the peeling of each protective tape 62 from the release paper 64 can be reliably started. Furthermore, since the adhesion of each protective tape 62 is reduced in only the front end portion as a small area, each protective tape 62 attached to the wafer W can be securely held on the upper surface of the wafer W. Accordingly, even when the back side of the wafer W is ground in the condition where the protective tape 62 attached to the front side of the wafer W is held on a chuck table, there is no possibility that the protective tape 62 may be slipped on the front side of the wafer W, so that the front side of the wafer W can be reliably protected by the protective tape 62. After finishing the subsequent steps including a grinding step, the protective tape 62 may be removed from the wafer W by applying ultraviolet light to the whole of the protective tape 62.

The present invention is not limited to the above preferred embodiment, but various modifications may be made within the scope of the present invention. For example, in the protective tape attaching apparatus 10 according to the above preferred embodiment, the ultraviolet applying means 56 is located above the lateral center of the sheet 60 stretched between the sheet feeding means 40 and the bending plate 50, so that ultraviolet light is applied from the ultraviolet applying means 56 to the front end portion of each protective tape 62 just before performing the bending step, thereby forming the peeling start point S at the front end portion of each protective tape 62 where the adhesion of each protective tape 62 is reduced. However, in the protective tape attaching method according to the present invention, the timing of forming the peeling start point S on each protective tape 62 may be any timing before performing the bending step and this timing is not especially limited. For example, at the time the sheet 60 is rolled to form the protective tape roll R, ultraviolet light may be applied to the front end portion of each protective tape 62 to thereby form the peeling start point S on each protective tape 62.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A protective tape attaching method for attaching a protective tape to a wafer, said protective tape having an adhesive layer formed on one side, said adhesive layer having adhesion to be reduced by applying ultraviolet light, said protective tape having a size corresponding to the size of said wafer, said protective tape attaching method comprising:
   a bending step of bending a release paper to which said adhesive layer of said protective tape is previously attached, stretching said release paper to peel a front end portion of said protective tape from said release paper, and attaching said front end portion of said protective tape to said wafer;
   an attaching step of pressing the other side of said protective tape opposite to said adhesive layer by using a pressure roller to thereby bring said adhesive layer of said protective tape into close contact with said wafer after performing said bending step, and further stretching said release paper to fully peel said protective tape from said release paper and attach the whole of said protective tape to said wafer; and
   a peeling start point forming step of previously applying said ultraviolet light to said front end portion of said protective tape to thereby reduce the adhesion of said adhesive layer of said front end portion of said protective tape before performing said bending step, thereby forming a peeling start point where peeling of said protective tape from said release paper is started, at said front end portion of said protective tape.

* * * * *